(12) United States Patent
Eilert

(10) Patent No.: US 8,521,952 B2
(45) Date of Patent: Aug. 27, 2013

(54) HIERARCHICAL MEMORY ARCHITECTURE WITH A PHASE-CHANGE MEMORY (PCM) CONTENT ADDRESSABLE MEMORY (CAM)

(75) Inventor: Sean Eilert, Penryn, CA (US)

(73) Assignee: Micron Technology, Inc., Boise, ID (US)

( * ) Notice: Subject to any disclaimer, the term of this patent is extended or adjusted under 35 U.S.C. 154(b) by 434 days.

(21) Appl. No.: 12/416,022

(22) Filed: Mar. 31, 2009

(65) Prior Publication Data

US 2010/0250843 A1 Sep. 30, 2010

(51) Int. Cl.
*G06F 13/00* (2006.01)
*G06F 13/28* (2006.01)

(52) U.S. Cl.
USPC ..... 711/108; 711/101; 711/170; 711/E12.001

(58) Field of Classification Search
USPC .......................................................... 711/108
See application file for complete search history.

(56) References Cited

U.S. PATENT DOCUMENTS

| | | | | |
|---|---|---|---|---|
| 5,339,268 | A * | 8/1994 | Machida | 365/49.17 |
| 6,252,790 | B1 * | 6/2001 | Shectman | 365/49.1 |
| 6,597,595 | B1 * | 7/2003 | Ichiriu et al. | 365/49.18 |
| 7,260,674 | B2 * | 8/2007 | Mukherjee | 711/108 |
| 2006/0067097 | A1 * | 3/2006 | Lien et al. | 365/49 |
| 2007/0002608 | A1 * | 1/2007 | Hsu et al. | 365/163 |
| 2007/0255891 | A1 * | 11/2007 | Chow et al. | 711/103 |

* cited by examiner

*Primary Examiner* — Reginald Bragdon
*Assistant Examiner* — Eric S Cardwell
(74) *Attorney, Agent, or Firm* — Schwegman, Lundberg & Woessner, P.A.

(57) ABSTRACT

A Phase-Change Memory (PCM) Content Addressable Memory (CAM) utilized to store addresses of defective rows or columns of a memory array or memories attached to a backside bus of a concentrator device.

24 Claims, 4 Drawing Sheets

HIERARCHICAL MEMORY ARCHITECTURE WITH A PHASE-CHANGE MEMORY (PCM) CONTENT ADDRESSABLE MEMORY (CAM)

BACKGROUND

With current microprocessors, the data transaction between the CPU and/or core logic and system memory becomes the bottleneck of system performance. Due to the intrinsic capacitances of system-level buses, a considerable amount of power may be dissipated at the input/output interface of a processor when binary data is transmitted. Simultaneous power and timing optimization to account for bus latency are critical design constraints taken into account to improve system performance. Additional improvements are needed at the interface to mass-storage memory devices.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
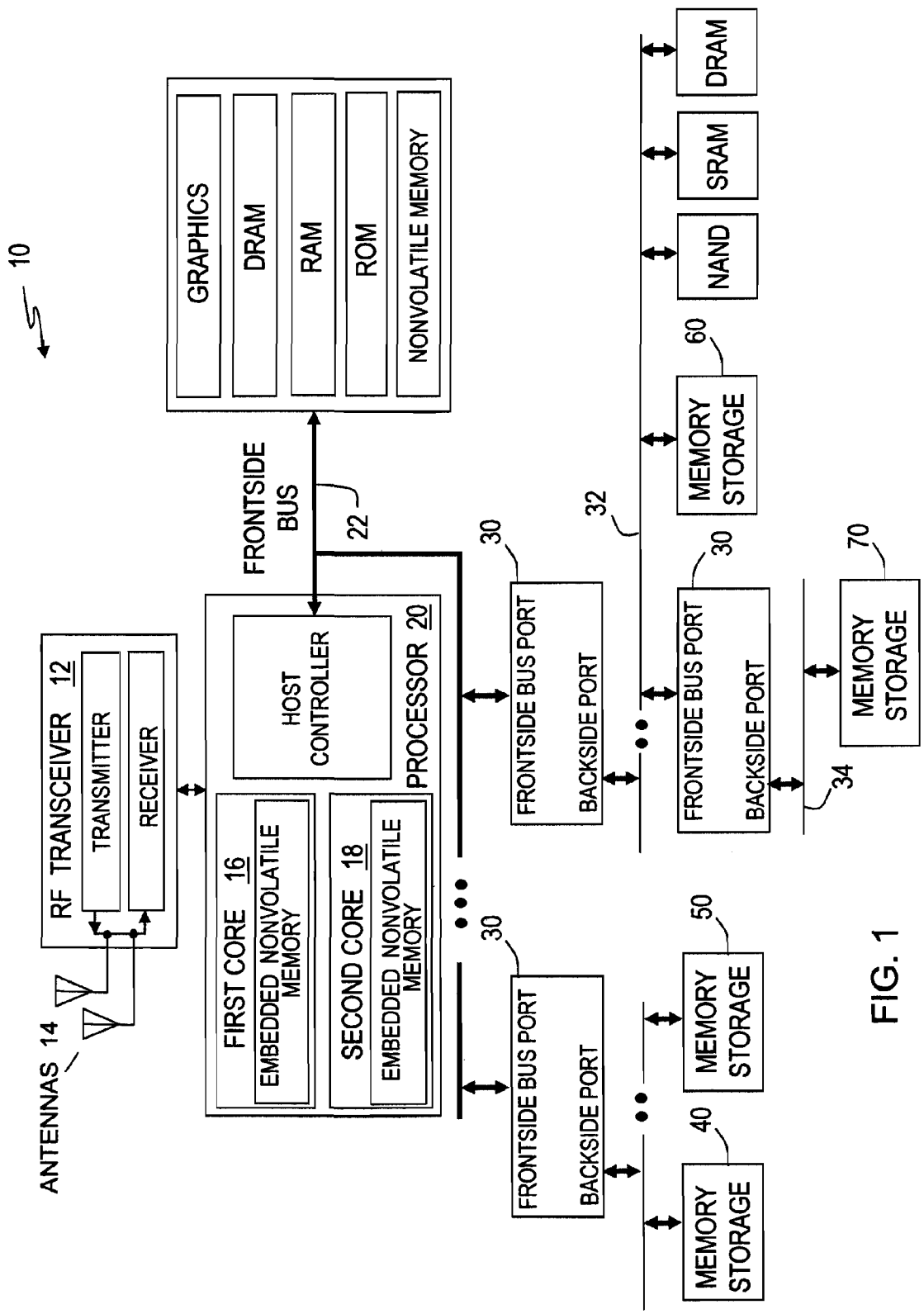
FIG. 1 is an embodiment of a wireless device that illustrates a hierarchical memory architecture that may be used to access memory storage in accordance with the present invention.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Use of the terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g. as in a cause and effect relationship).

The wireless architecture embodiment illustrated in FIG. 1 shows a system 10 that includes a processor that communicates with multiple storage devices in a hierarchical arrangement in accordance with the present invention. Although the figure shows a wireless communications embodiment, it should be noted that the present invention is not limited to electronic devices that communicate in a wireless environment and other, non-wireless applications may make use of the present invention.

As shown in this wireless embodiment, system 10 may include one or more antenna structures 14 to allow radios to communicate with other over-the-air communication devices. As such, system 10 may operate as a cellular device or a device that operates in wireless networks such as, for example, Wireless Fidelity (Wi-Fi) that provides the underlying technology of Wireless Local Area Network (WLAN) based on the IEEE 802.11 specifications, WiMax and Mobile WiMax based on IEEE 802.11-2005, Wideband Code Division Multiple Access (WCDMA), and Global System for Mobile Communications (GSM) networks, although the present invention is not limited to operate in only these networks. The radio subsystems collocated in the same platform of system 10 provide the capability of communicating with different frequency bands in an RF/location space with other devices in a network. It should be understood that the scope of the present invention is not limited by the types of, the number of, or the frequency of the communication protocols that may be used by system 10.

The embodiment illustrates the coupling of antenna structure 14 to a transceiver 12 to accommodate modulation/demodulation. In general, analog front end transceiver 12 may be a stand-alone Radio Frequency (RF) discrete or integrated analog circuit, or transceiver 12 may be embedded with a processor 20 having one or more processor cores 16 and 18. The multiple cores allow processing workloads to be shared across the cores and handle baseband functions and application functions. The Front Side Bus (FSB) 22 provides an interface between the processor and chipset components and system memory storage. The FSB is a multiprocessing interface to processors, memory, and I/O that may be used to provide communication or information between the processor and the memory storage. The FSB signals may use Gunning Transceiver Logic (GTL+) signaling technology having differential input buffers which use a reference level by the receivers to determine if a signal is a logical 0 or a logical 1, although the scope of the present invention is not limited in this respect.

One or more concentrator devices 30 are connected to FSB 22 and become the channel to access other memory devices. Embodiments of the present invention, as illustrated in the figure, allow concentrator device 30 to be connected in tandem with additional memory storage. This tandem connection is shown by the placement of memory storage 40 and/or memory storage 50 behind concentrator device 30. In this arrangement, concentrator device 30 separates NAND, RAM, and other memory storage devices from FSB 22, thus reducing the intrinsic capacitance associated with the system-level bus.

The embodiment also illustrates another concentrator device 30 with a frontside bus port connected to FSB 22 and a backside port connected to a bus 32. This backside port may be configured to communicate over a half-duplex bidirectional bus as is shown in the figure or may be configured to communicate over a full-duplex bidirectional bus. The upstream path going from the backside attached memory to the concentrator device need not have exactly the same bandwidth as the downstream path going from the concentrator device to the backside attached memory. Multiple memory storage devices, represented by memory storage 60, may be connected to bus 32.

Yet another concentrator device 30 is shown having a frontside bus port connected to bus 32 and a backside port connected to a bus 34. Memory storage devices, depicted by memory storage 70, are connected to bus 34. Thus, it has been shown that properly arranged concentrator device(s) 30 allow a succession of memory devices and enable attachment of a memory depth to a processor controller with a limited pin count. Concentrator device(s) 30 open the system mass memory storage and make possible a hierarchical memory architecture with a memory capacity limited mainly by practical physical constraints.

It should be noted that concentrator device 30 and the volatile and nonvolatile memories may be packaged separately. Alternatively, concentrator device 30 may be combined with the volatile and nonvolatile memory devices in a stacking process. The footprint on a board may be reduced by placing concentrator device 30 in a multi-chip package with other memory components and computing devices. Processor 20 may also be included in this multi-chip package.

Concentrator device 30 sits between processor 20 and memory storage devices that may have different storage mechanisms and different interface formats. The concentrator device provides an interface to accommodate the different memory formats such as, for example, NOR having random-access reading, NAND providing page accesses, and RAM allowing DDR.

Figure 2:
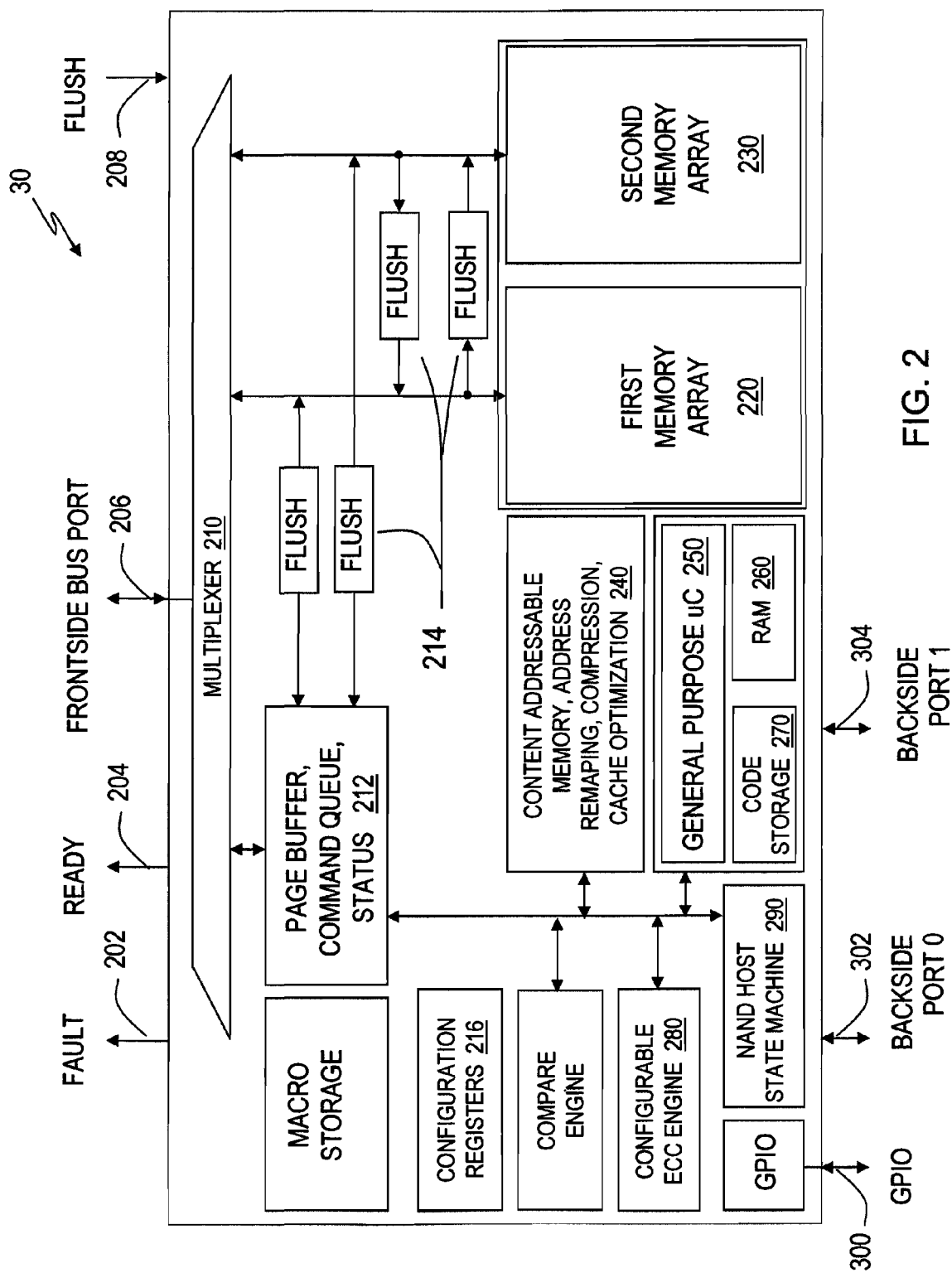
FIG. 2 is a schematic representation of a concentrator device that makes possible a hierarchical memory architecture in accordance with the present invention.

FIG. 2 is a block diagram of concentrator device 30 that, as previously stated, channels data between processor 20 and other types of volatile and nonvolatile memories that are connected to the backside ports. Concentrator device 30 captures information through the frontside port and provides high speed communication with FSB 22, provides support for direct writes, and provides high speed Double Data Rate (DDR) bus transactions that transfer data at twice the clock rate. A DDR multiplexer 210 is connected to frontside bus port 206 and provides the interface between the FSB 22 and the mixed memory types that may include, for example, PCM, MRAM, FRAM, SRAM, and Pseudo SRAM.

To control memory operations, concentrator device 30 includes a Page Buffer, Command Queue, and Status Block 212 that interprets the command set and issues memory commands. An internal controller handles the operational timings and verifies the correct execution of the memory commands such as, for example, write commands, read commands, and flush commands. Additionally, a host of commands such as "Status read", "copy", "move", or "error-correct" may be supported in this architecture. The controller supplies the status register whose register bits convey information about the status and report on any errors that may occur during memory operations. The status register output may be read to monitor the progress during command operations or report the result of the memory operations.

The page buffer holds several words that are to be programmed as a group into a memory cell block and also buffers a large quantity of data read from the memory cell block. The page buffer is filled with words to be programmed before issuing the programming command that then transfers data from the page buffer to the memory cells in the memory arrays. In this fashion one page is programmed, and after the program and verify processes are complete, the program and verify processes for a next page may be executed. A read command executes to read data from the memory cells to the page buffer that is then transferred out. It should be noted that programming may start prior to transferring all of the data across the host interface. The data can propagate down through the hierarchy with some level of buffering until a sufficient amount of information is transferred to the target for programming to commence.

A flush pin 208 initiates the dumping of contents of RAM 260 to PCM, i.e., first memory array 220 and second memory array 230. In addition, flush commands with an associated address dump the RAM contents to PCM storage (denoted by blocks 214). The flush functionality is useful for "check pointing" RAM contents to nonvolatile memory and for use during power loss scenarios where the contents of RAM are autonomously copied to nonvolatile storage. In some embodiments concentrator device 30 may act as a bus master for the frontside bus 22 to copy the contents of RAM or DRAM to nonvolatile memory in the hierarchy of device 30, allowing other components of the system to be powered down.

A Configuration Register 216 is used to set the default operation of concentrator device 30. The command interface may be used to update the configuration register and change the concentrator device's behavior. Configuration Register 216 is used to configure the type of bus access that the memory performs and provide alternative operating modes.

The multiple bank architecture as illustrated by first memory array 220 and second memory array 230 provides flexibility for splitting the code and data spaces within the memory arrays. The dual operations allow code to be executed from one bank while the other bank is being programmed or erased. While programming or erasing in one bank, read operations are possible in the other bank. In one embodiment the first and second memory arrays are Phase Change Memory (PCM) arrays, also referred to as Phase-Change Random Access Memory (PRAM or PCRAM), Ovonic Unified Memory (OUM) or Chalcogenide Random Access Memory (C-RAM). The arrays of PCM cells include alloys of elements of group VI of the periodic table, elements such as Te or Se that are referred to as chalcogenides or chalcogenic materials.

Chalcogenides may be used advantageously in phase change memory cells to provide data retention and remain stable even after the power is removed from the nonvolatile memory. Taking the phase change material as $Ge_2Sb_2Te_5$ for example, two phases or more are exhibited having distinct electrical characteristics useful for memory storage. The chalcogenic material may be electrically switched between different states intermediate between the amorphous and the crystalline states, thereby giving rise to a multilevel storing capability.

In another embodiment the first and second memory arrays 220 and 230 may be Magnetic Random Access Memory (MRAM) cells where magnetic storage elements are formed from two ferromagnetic plates (not shown) located at an intersection of a row and column line and selected by a Magnetic Tunnel Junction (MTJ) device (not shown). Current imparted to the row line in one direction causes a magnetic field operative on the MRAM cell biasing the MRAM cell toward a binary state. Due to a magnetic tunnel effect, the electrical resistance of the memory cell changes based on the orientation of the fields in the two plates.

In yet another embodiment the first and second memory arrays 220 and 230 may be Ferroelectric Random Access Memory (FRAM) cells. The transistor-capacitor cell (not shown) includes the ferroelectric material where a bi-stable atom is shifted to form two stable polarization states. Memory cell data may be written by positively or negatively orienting the dipoles of the ferroelectric material via an applied polarizing voltage. Read control circuitry senses the direction of the stable electric polarization that remains in place even after the electric field is removed.

A block labeled Content Addressable Memory (CAM), Address Remapping, Compression, and Cache Optimization 240 provides multiple functions. The CAM array(s) may be utilized to store the addresses of defective rows or columns of first memory array 220 and/or second memory array 230 or memories attached to the backside bus. In one embodiment of this invention, the CAM is used for NAND memory attached to the backside bus to map around bad blocks. The CAM provides access to remapping information in tens of nanoseconds, for example, versus the hundreds of nanoseconds or even microseconds of time that would be necessary to search through memory to discover this mapping information. The CAM is also used where NAND contents are being cached in PCM. In this case, the CAM may be used to quickly ascertain if the target contents are currently stored in PCM, and in the case where they are, the address location(s) where they are stored.

Figure 3:
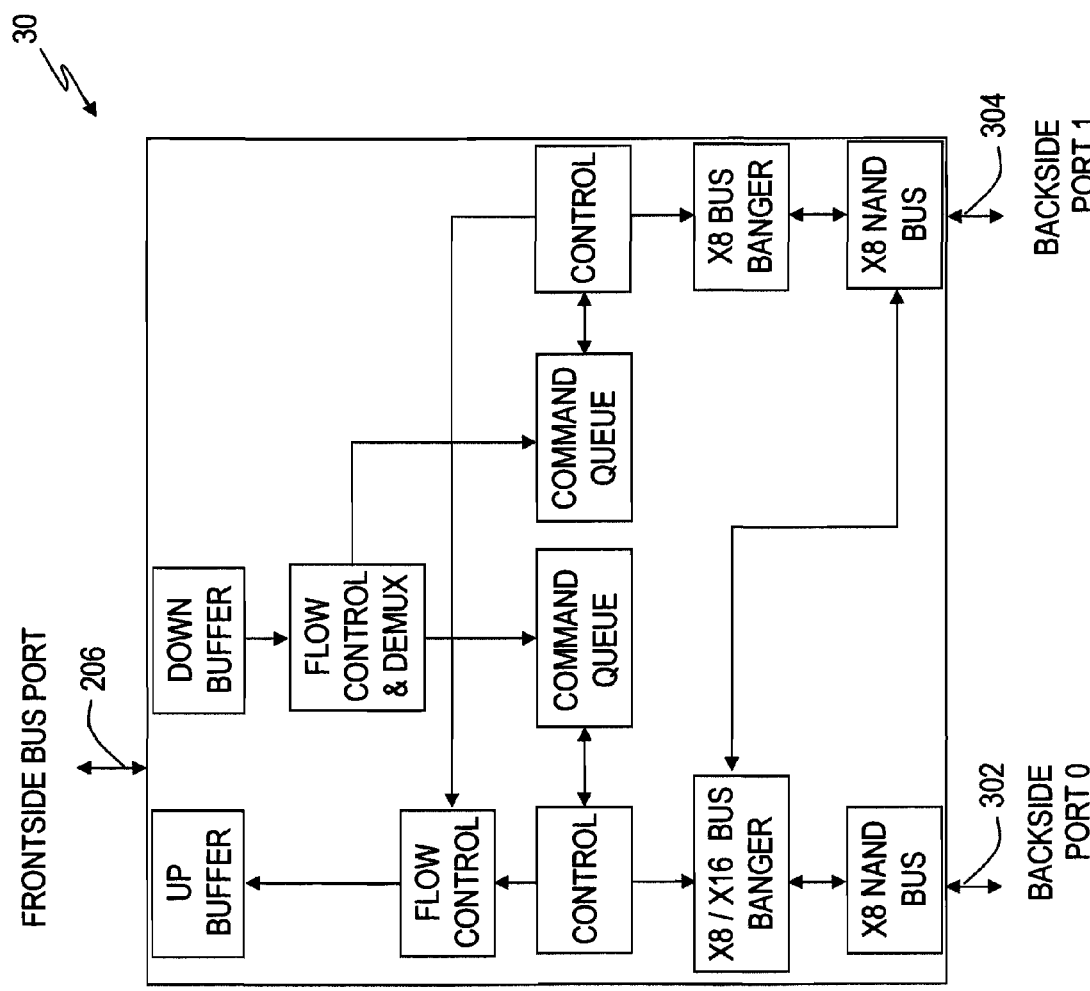
FIG. 3 is a block representation of addressing within the concentrator device.

FIG. 3 is a block presenting the addressing within the concentrator device. Concentrator device 30 receives through the frontside bus port 206 the address information that may be used to access the memory devices attached at various locations in the hierarchy. This NAND address information may or may not be remapped as it passes through the hierarchy tree. For NAND port addressing each concentrator device 30 knows the types of memory devices that are attached to the backside ports via a discovery process. An internal lookup table associates 'long' addresses to 'short' addresses. The long addresses include a complete roadmap to the target port such as, for example, a '0' may represent the port on the left and a '1' may represent the port on the right. The short addresses may be used for inter-device communication and include a sequential list of valid ports for the lower tree.

For PCM address mapping each concentrator device knows the types of memory that are attached to its backside ports via a discovery process. Each concentrator device 30 includes a lookup table for associating 'long' addresses to 'short' addresses. Again, the roadmap may have a '0' to represent the port on the left and a '1' to represent the port on the right. The short addresses may be used for inter-device communication and include a sequential list of valid ports for the lower tree.

Figure 4:
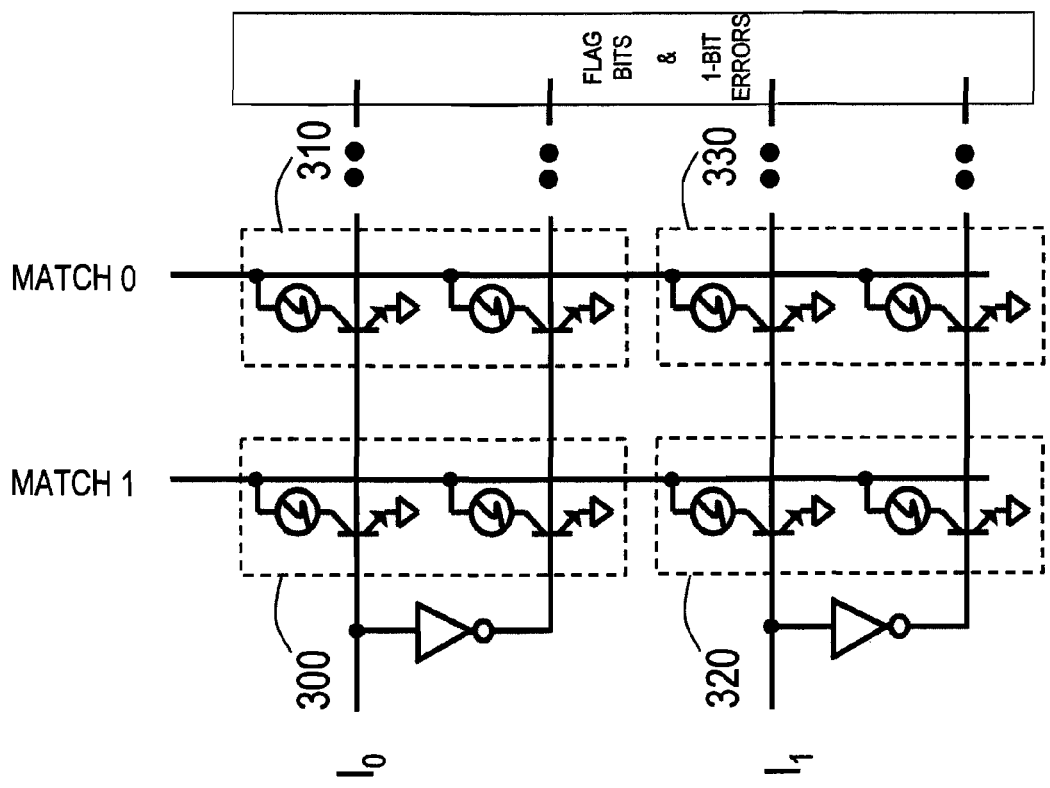
FIG. 4 is a schematic representation of a 2×2 Phase-Change Memory (PCM) Content Addressable Memory (CAM) array in accordance with the present invention.

FIG. 4 shows a portion of the PCM CAM that for simplicity of description and ease of illustration is shown as a 2×2 array. Each CAM cell 300, 310, 320, and 330 includes two PCM storage locations to match one bit. The figure shows a ternary CAM having the capability of being able to ignore some bits, and thus, effectively provide 'don't care' states. The two PCM memory elements in each cell can be programmed 'on' or programmed 'off'. The CAM compares every bit of the input pattern to the match value stored in the memory array. Depending on the state of the inputs $I_0$ and $I_1$ relative to the state of the cells, the "MATCH" wires are either pulled down or not pulled down and provide a static output representative of the states of the internal memory cells. A comparison circuit (not shown) at the top of the MATCH lines indicates whether all of the inputs match the content. It should be noted that flag bits may be added to the end of the CAM array to indicate 1-bit errors and also unused elements that may be used for repair.

Figure 5:
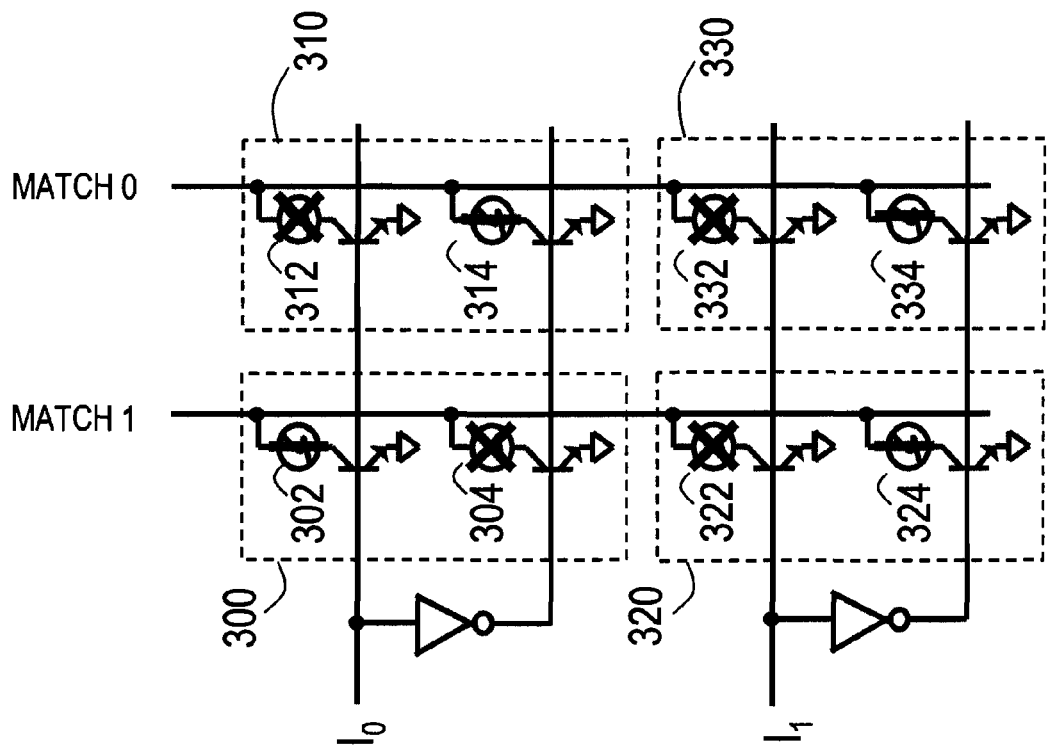
FIG. 5 illustrates a programmed example of the PCM CAM array shown in FIG. 4.

FIG. 5 shows the same portion of the PCM CAM as FIG. 4 having data programmed and stored in the array. In this example, CAM cell 300 includes a storage location 302 programmed to store a "1" and a storage location 304 programmed to store a "0". The selector device in CAM cell 300 connected to storage location 302 receives the search data $I_0$, whereas the selector device connected to storage location 304 receives the complement of search data $I_0$. CAM cell 310 includes a storage location 312 programmed to store a "0" and a storage location 314 programmed to store a "1". The selector device in CAM cell 310 connected to storage location 312 receives the search data labeled $I_0$, whereas the selector device connected to storage location 314 receives the complement of search data $I_0$.

Further based on this example, CAM cell 320 includes a storage location 322 programmed to store a "0" and a storage location 324 programmed to store a "1". The selector device in CAM cell 320 connected to storage location 322 receives the search data $I_1$, whereas the selector device connected to storage location 324 receives the complement of search data $I_1$. CAM cell 330 includes a storage location 332 programmed to store a "0" and a storage location 334 programmed to store a "1". The selector device in CAM cell 330 connected to storage location 332 receives the search data labeled $I_1$, whereas the selector device connected to storage location 334 receives the complement of search data $I_1$.

In operation, a MATCH output is a function of the state of one input and the state of the two storage elements in one CAM cell in the CAM array. By way of example, block 300 shows an input $I_0$ and a complimented $I_0$ input, along with the one output labeled MATCH0. Memory cell 300 has two PCM memory elements, i.e., the memory elements denoted as 'Element 302' and 'Element 304', which may be programmed either 'on' or 'off'. The following table describes the functionality of the MATCH0 output based on the state of $I_0$ and the programmed values:

| Element 0 | Element 1 | MATCH0 output |
|---|---|---|
| On | Off | Matches when $I_0 = 0$, does not match when $I_0 = 1$; |
| Off | On | Matches when $I_0 = 0$, does not match when $I_0 = 1$; |
| On | On | Unused (disables match - MATCH 0 will not match any input); |
| Off | Off | Ignore input bit $I_0$. |

Returning to FIG. 2 and the block labeled Content Addressable Memory (CAM), Address Remapping, Compression, and Cache Optimization 240, the data compression function can be effectively used in managing this memory based storage system. A variety of data compression algorithms adaptable to various standards and formats are supported to expand the write bandwidth and the storage capacity. The remap function allows startup code to be used for program control and then a remapping can cause new settings to take place, which cause the entire memory layout to change.

A microcontroller (uC) 250 integrates counters/timers, an interrupt structure, configurable I/O ports such as General Purpose Input/Output (GPIO) 300, and selectable modes of power reduction, amongst other processing functions. By way of example, uC 250 may include an operating mode to activate security features that regulate access requests to contents of locations of program memory. With security activated, concurrent programming (i.e., programming of one area of memory using instructions executing from another area of memory) can be initiated under predetermined secure conditions.

A Code storage block 270 provides for fast access to code and content that doesn't change often such as, for example, the BIOS in PCs and the operating system in a cell phone.

A configurable Error-Correcting Code (ECC) Engine 280 provides error detection and correction schemes. Error detection and correction schemes compensate for problems associated with writing accuracy and repeatability. Error-correcting code is a code in which each data signal conforms to specific rules of construction so that departures from this construction in the received signal can generally be automatically detected and corrected. Configurable ECC Engine 280 monitors, fixes, and prevents memory bit errors. MLC flash memories normally require more complex error-correction code circuits that are handled by Configurable Error-Correcting Code (ECC) Engine 280.

A NAND Host State Machine 290 controls operations in support of connecting NAND memory to a backside port, i.e., Backside Port 0 labeled 302 or Backside Port 1 labeled 304. The state machine extracts a command and operation information to control the internal NAND interface and adjust data input and/or output between the NAND interface and the buffer memory based on the command and the address. Additionally, this state machine monitors and reports status of the NAND it controls. The state machine may output the data to the error correction logic in Configurable ECC Engine 280. The error correction logic performs error correction on the data and outputs a result back to the state machine. With integrated capabilities like address lookup through a Content Addressable Memory, Error Correction, and control orchestrated via a microcontroller, this subsystem can, properly configured, act as a multi-core NAND management subsystem or an autonomous computing subsystem.

By now it should be apparent that embodiments of the present invention allow increased memory storage efficiencies through hierarchical data storage by using features of the present invention. By connecting the frontside port of a concentrator device to the host processor, memory devices such as NAND, RAM, and other memory storage devices may be connected to the backside port. Thus, a hierarchical memory architecture is provided by incorporating one or more concentrator devices in a memory storage system.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

The invention claimed is:

1. A concentrator device comprising:
 a front side port to couple to a processor and provide hierarchical storage to memory devices coupled to a backside port; and
 a Content Addressable Memory (CAM), the concentrator device is to cache data received from the backside port, the CAM to make a determination whether target contents are stored in a Phase-Change Memory (PCM) array separate from the CAM, the CAM being further configured to provide address locations in the PCM array where the target contents are stored, at least one CAM cell of the CAM having two PCM storage locations including a first PCM storage location and a second PCM storage location, one end of the first PCM storage location being coupled to a match line of the CAM and a gate of the first PCM storage location to receive a search data value as an input, one end of the second PCM storage location being coupled to the match line and a gate of the second PCM storage location to receive a complemented value of the search data value as a complemented input.

2. The concentrator device of claim 1, wherein the CAM is further configured to store addresses of defective rows or columns of the PCM array.

3. The concentrator device of claim 1, wherein the memory devices comprise a NAND memory, wherein the CAM is configured to provide addresses of defective memory locations to map around bad blocks for the NAND memory.

4. The concentrator device of claim 1, wherein the two PCM storage locations are configured to match one bit of data.

5. The concentrator device of claim 1, wherein the at least one CAM cell includes its own associated comparison circuit to detect a match between a stored bit and an input bit.

6. The concentrator device of claim 1, wherein the memory devices are associated with a plurality of different memory formats including at least one of a plurality of memory types where the memory types include NAND, PCM, Magnetic Random Access Memory (MRAM), Ferroelectric Random Access Memory (FRAM), Static Random Access Memory (SRAM), and Pseudo SRAM.

7. The concentrator device of claim 6, further comprising an interface to accommodate the plurality of different memory formats.

8. A concentrator device to transfer data between a processor and external memory devices, comprising:
 a Phase-Change Memory (PCM) array;
 a page buffer to store the data received from the processor for programming into the PCM array; and
 a Content Addressable Memory (CAM) comprising a plurality of CAM cells, the CAM to make a determination whether target contents are stored in the PCM array and to provide address locations in the PCM array where the target contents are stored, at least one of the plurality of CAM cells includes two PCM storage locations used to match one data bit, the two PCM storage locations including a first PCM storage location and a second PCM storage location, one end of the first PCM storage location being coupled to a match line of the CAM and a gate of the first PCM storage location to receive a search data value as an input, one end of the second PCM storage location being coupled to the match line and a gate of the second PCM storage location to receive a complemented value of the search data value as a complemented input.

9. The concentrator device of claim 8, wherein each of the plurality of CAM cells has its own associated comparison circuit to detect a match between a stored bit and an input bit.

10. The concentrator device of claim 8, wherein the at least one of the plurality of CAM cells further comprises:
 a first selector device having a control terminal to receive the search data value; and
 a second selector device having a control terminal to receive the complemented value, the first PCM storage location being coupled between a conduction terminal of the first selector device and a match output, the second PCM storage location being coupled between a conduction terminal of the second selector device and the match output.

11. The concentrator device of claim 8, wherein the CAM includes a storage location for a flag bit to indicate a 1-bit error.

12. The concentrator device of claim 8, wherein the CAM includes a storage location for a flag bit to indicate an unused element that is used for repair.

13. A Content Addressable Memory (CAM), comprising:
a match line; and
a CAM cell having two Phase-Change Memory (PCM) storage locations used to match one data bit, the two PCM storage locations including a first PCM storage location and a second PCM storage location, one end of the first PCM storage location being coupled to the match line and a gate of the first PCM storage location to receive a search data value as an input, one end of the second PCM storage location being coupled to the match line and a gate of the second PCM storage location to receive a complemented value of the search data value as a complemented input.

14. The CAM of claim 13, wherein the CAM cell further comprises:
a first selector device having a control terminal to receive the search data value; and
a second selector device having a control terminal to receive the complemented value, wherein the first PCM storage location is coupled between a conduction terminal of the first selector device and a match output and the second PCM storage location is coupled between a conduction terminal of the second selector device and the match output.

15. The CAM of claim 13, further comprising a storage location for a flag bit to indicate a 1-bit error.

16. The CAM of claim 13, further comprising a storage location for a flag bit to indicate an unused element that is used for repair.

17. The CAM of claim 13, wherein the CAM cell is configured to store information to be compared with the input to determine if target contents are stored in a PCM array separate from the CAM, and to provide address locations in the PCM array where the target contents are stored.

18. The CAM of claim 13, further comprising:
another match line; and
another CAM cell comprising a third PCM storage location and a fourth PCM storage location, one end of the third PCM storage being coupled to the other match line and a gate of the third PCM storage location configured to receive the search data value, one end of the fourth PCM storage location being coupled to the other match line and a gate of the fourth PCM storage location configured to receive the complemented value.

19. The CAM of claim 13, wherein the match line is configured to produce a value corresponding to a match as an output only when one of the first PCM location and the second PCM location is on and the other is off.

20. The CAM of claim 13, wherein the match line is configured to be disabled when both the first PCM location and the second PCM location are on.

21. The CAM of claim 13, wherein the match line is configured to ignore the input.

22. A Content Addressable Memory (CAM), comprising:
a match line; and
a CAM cell having two Phase-Change Memory (PCM) storage locations used to match one data bit, the two PCM storage locations including a first PCM storage location and a second PCM storage location, one end of the first PCM storage location being coupled to the match line and a gate of the first PCM storage location to receive a search data value as an input, one end of the second PCM storage location being coupled to the match line and a gate of the second PCM storage location to receive a complemented value of the search data value as a complemented input, the CAM cell being configured to store remapping information to map around defective memory locations.

23. The CAM of claim 22, further comprising a remapping circuit used by a host in a reclaim operation to move a subset of the contents of a first memory block to a second memory block and erase the first block.

24. The CAM of claim 22, further comprising an inverter coupled with the CAM cell, the inverter configured to provide the complemented value using the search data value.

* * * * *